US008810833B2

(12) United States Patent
Suzuki et al.

(10) Patent No.: US 8,810,833 B2
(45) Date of Patent: Aug. 19, 2014

(54) IMAGE PROCESSING DEVICE AND IMAGE FORMING APPARATUS

(75) Inventors: Shiroh Suzuki, Kanagawa (JP); Tetsuo Ishizuka, Kanagawa (JP); Fumio Furusawa, Kanagawa (JP); Osamu Uto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 699 days.

(21) Appl. No.: 13/015,749

(22) Filed: Jan. 28, 2011

(65) Prior Publication Data

US 2012/0044521 A1 Feb. 23, 2012

(30) Foreign Application Priority Data

Aug. 18, 2010 (JP) ................................ 2010-183338

(51) Int. Cl.

| | |
|---|---|
| ***H05K 1/11*** | (2006.01) |
| ***H05K 1/14*** | (2006.01) |
| ***H05K 7/14*** | (2006.01) |
| ***H05K 7/18*** | (2006.01) |
| ***G03G 15/00*** | (2006.01) |

(52) U.S. Cl.

USPC ............ 358/1.15; 399/110; 399/90; 361/788; 361/790; 361/792; 361/796; 361/798; 361/801; 361/802; 347/138; 347/152

(58) Field of Classification Search

USPC ......... 361/788, 790, 792, 796, 798, 801, 802; 347/138, 152; 399/90, 110

See application file for complete search history.

(56) References Cited

U.S. PATENT DOCUMENTS

| | | | | |
|---|---|---|---|---|
| 5,410,641 | A * | 4/1995 | Wakabayashi et al. | 358/1.13 |
| 5,544,008 | A * | 8/1996 | Dimmick et al. | 361/679.32 |

(Continued)

FOREIGN PATENT DOCUMENTS

| | | |
|---|---|---|
| JP | H02-73696 | 3/1990 |
| JP | 2006-191217 A | 7/2006 |

(Continued)

OTHER PUBLICATIONS

Office Action issued by Japanese Patent Office in counterpart Japanese Application No. 2010-183338, dated May 20, 2014.

*Primary Examiner* — King Poon
*Assistant Examiner* — Vincent Peren
(74) *Attorney, Agent, or Firm* — Sughrue Mion, PLLC

(57) ABSTRACT

An image processing device includes a body that has a first connection portion and a second connection portion inside the body; an image processing board that is electrically connected to the first connection portion, the image processing board performing image processing; a functional board that is disposed so as to cover a part of the image processing board on one side of the image processing board; a side panel attached to the image processing board at a position opposite to the first connection portion, the side panel being a part of a side surface of the body; and an extension board disposed so as to cover another part of the image processing board on the same side as the functional board with respect to the image processing board, the extension board being electrically connected to the second connection portion and independently attachable to and removable from the image processing board.

6 Claims, 9 Drawing Sheets

(56) References Cited

U.S. PATENT DOCUMENTS

| | | | | | |
|---|---|---|---|---|---|
| 5,659,459 | A * | 8/1997 | Wakabayashi et al. | 361/753 |
| 5,845,144 | A * | 12/1998 | Tateyama et al. | 712/1 |
| 6,625,035 | B1 * | 9/2003 | Steinman et al. | 361/759 |
| 6,646,890 | B1 * | 11/2003 | Byers et al. | 361/802 |
| 2002/0145858 | A1 * | 10/2002 | Hayashi et al. | 361/798 |
| 2005/0265010 | A1 * | 12/2005 | Bundza et al. | 361/796 |
| 2006/0227525 | A1 * | 10/2006 | Hoshino et al. | 361/796 |
| 2009/0122496 | A1 | 5/2009 | Nishimoto et al. | |
| 2011/0002099 | A1 * | 1/2011 | Chen et al. | 361/679.58 |

FOREIGN PATENT DOCUMENTS

| | | | |
|---|---|---|---|
| JP | 2008-153363 | A | 7/2008 |
| JP | 2008-153364 | A | 7/2008 |
| JP | 2009-117680 | | 5/2009 |

* cited by examiner

IMAGE PROCESSING DEVICE AND IMAGE FORMING APPARATUS

CROSS-REFERENCE TO RELATED APPLICATIONS

This application is based on and claims priority under 35 USC 119 from Japanese Patent Application No. 2010-183338 filed Aug. 18, 2010.

BACKGROUND

Technical Field

The present invention relates to an image processing device and an image forming apparatus.

SUMMARY

According to an aspect of the invention, an image processing device includes a body that has a first connection portion and a second connection portion inside the body; an image processing board that is electrically connected to the first connection portion, the image processing board performing image processing; a functional board that is disposed so as to cover a part of the image processing board on one side of the image processing board, the functional board having at least one function; a side panel attached to the image processing board at a position opposite to the first connection portion, the side panel being a part of a side surface of the body; and an extension board that is disposed so as to cover another part of the image processing board on the same side as the functional board with respect to the image processing board, the extension board being electrically connected to the second connection portion, and the extension board being independently attachable to and removable from the image processing board.

BRIEF DESCRIPTION OF THE DRAWINGS

Exemplary embodiment of the present invention will be described in detail based on the following figures, wherein.

DETAILED DESCRIPTION

An image processing device and an image forming apparatus according to an exemplary embodiment of the invention will be described.

Figure 1:
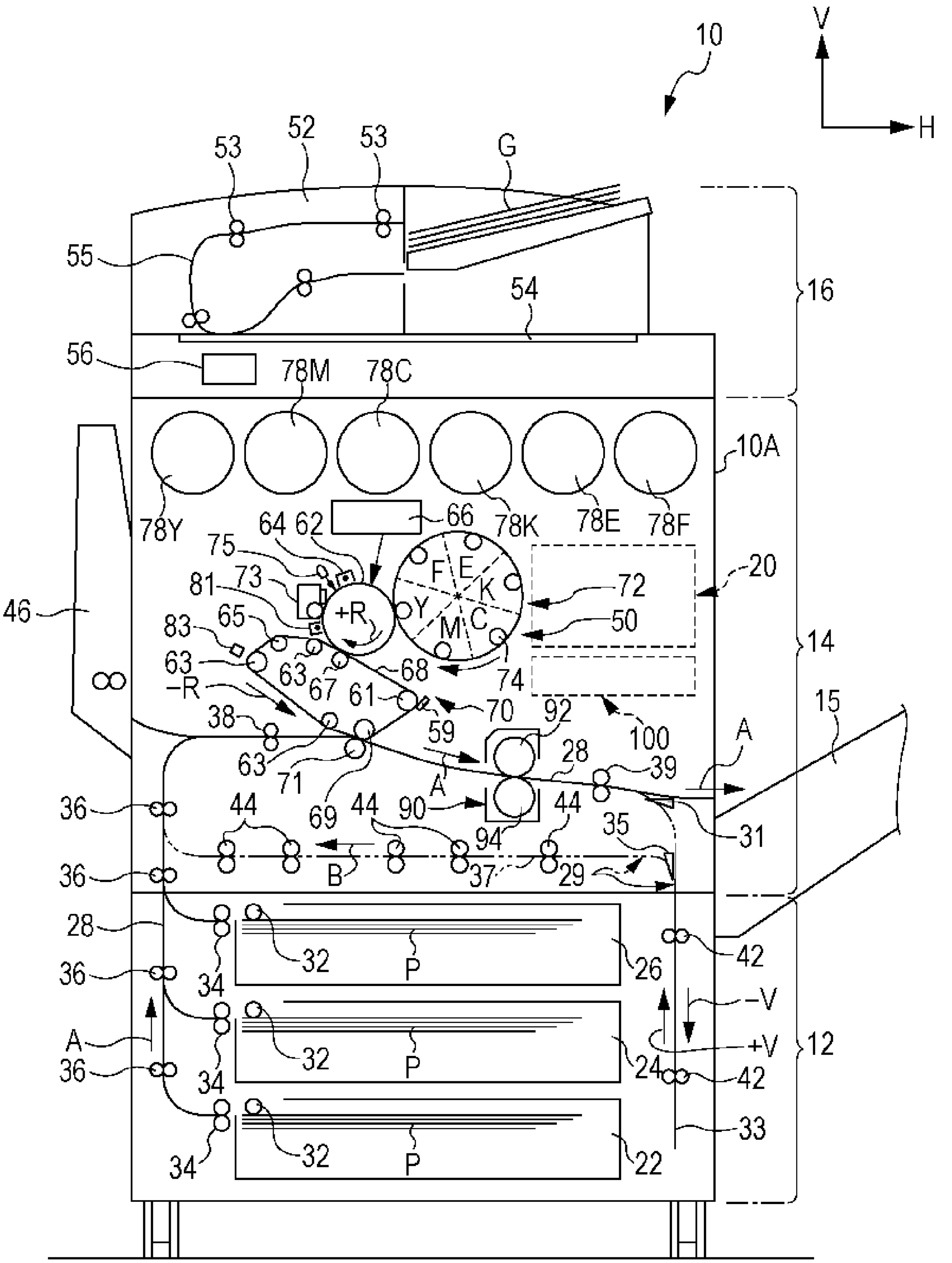
FIG. 1 is a schematic view illustrating the overall structure of an image forming apparatus according to an exemplary embodiment of the invention.

FIG. 1 illustrates an image forming apparatus 10 according to the exemplary embodiment. The image forming apparatus 10 includes, from below in the vertical direction (in the direction of arrow V), a sheet containing section 12, an image forming section 14, a document reading section 16, an image processing device 100, and a controller 20. The sheet containing section 12 contains recording sheets P, each of which is an example of a recording medium. The image forming section 14, which is disposed above the sheet containing section 12, forms an image on the recording sheet P that is supplied from the sheet containing section 12. The document reading section 16, which is disposed above the image forming section 14, reads an image of a document G. The image processing device 100 processes the data of the image read by the document reading section 16 and transfers image information that has been processed to the image forming section 14 (an image forming unit 50). The controller 20 (including an output control board 120 illustrated in FIG. 6), which is disposed in the image forming section 14, controls the operations of the sections and devices of the image forming apparatus 10. In the following description, the vertical direction and the horizontal direction with respect to an apparatus body 10A of the image forming apparatus 10 will be referred to as the direction of arrow V and the direction of arrow H, respectively.

The sheet containing section 12 includes a first container 22, a second container 24, and a third container 26, which contain recording sheets P having different sizes. The first container 22, the second container 24, and the third container 26 each have a feed roller 32 that feeds the recording sheet P to a transport path 28 disposed in the image forming apparatus 10. A pair of transport rollers 34 and a pair of transport rollers 36, which are disposed at positions on the transport path 28 that are downstream of the feed rollers 32, transport the recording sheets P one by one. Registration rollers 38 are disposed downstream of the transport rollers 36 in the transport direction of the recording sheet P on the transport path 28. The registration rollers 38 temporarily stop the recording sheet P and feed the recording sheet P to a second transfer position (described below) at a predetermined timing.

In a front view of the image forming apparatus 10, the upstream part of the transport path 28 extends linearly in the direction of arrow V from the left side of the sheet containing section 12 to a lower left portion of the image forming section 14. The downstream part of the transport path 28 extends from the lower left portion of the image forming section 14 to a sheet output tray 15 that is disposed on the right side surface of the image forming section 14. A duplex transport path 29 is connected to the transport path 28. The duplex transport path 29 transports and reverses the recording sheet P so that images are formed on both sides of the recording sheet P.

In a front view of the image forming apparatus 10, the duplex transport path 29 includes a first switching member 31, a reversing portion 33, a transporting portion 37, and a second switching member 35. The first switching member 31 switches between the transport path 28 and the duplex transport path 29. The reversing portion 33 extends linearly in the direction of arrow V (in FIG. 1, downward is −V and upward is +V) from a lower right portion of the image forming section 14 to the right side of the sheet containing section. The transporting portion 37 receives the trailing end of the recording sheet P that is transported to the reversing portion 33 and transports the recording sheet P in the direction of arrow H (toward the left side in FIG. 1). The second switching member 35 switches between the reversing portion 33 and the transporting portion 37. In the reversing portion 33, pairs of transport rollers 42 are disposed at plural positions with distances therebetween. In the transporting portion 37, pairs of transport rollers 44 are disposed at plural positions with distances therebetween.

The first switching member 31 is a triangular-prism-shaped member. A driving unit (not shown) moves the first switching member 31 so that an end of the first switching member 31 points to one of the transport path 28 and the duplex transport path 29, and thereby the transport direction of the recording sheet P is switched. Likewise, the second switching member 35 is a triangular-prism-shaped member in front view. A driving unit (not shown) moves the second switching member 35 so that an end of the second switching member 35 points to one of the reversing portion 33 and the transporting portion 37, and thereby the transport direction of the recording sheet P is switched. The downstream end of the transporting portion 37 is connected, through a guide member (not shown), to the transport path 28 at a position near a pair of the transport rollers 36 that are disposed in the upstream part of the transport path 28. A manual feed unit 46, which is foldable, is disposed on the left side surface of the image forming section 14. A transport path, along which the recording sheet P is transported from the manual feed unit 46, is connected to the transport path 28 at a position near the registration rollers 38.

The document reading section 16 includes a document transport device 52, a platen glass 54, and a document reading device 56. The document transport device 52 automatically transports documents G one by one. The platen glass 54, on which a single document G is placed, is disposed below the document transport device 52. The document reading device 56 reads the document G that is transported by the document transport device 52 or the document G that is placed on the platen glass 54.

The document transport device 52 includes an automatic transport path 55 in which pairs of transport rollers 53 are disposed. A part of the automatic transport path 55 is positioned such that the recording sheet P passes over the platen glass 54. The document reading device 56 is at rest at the left end of the platen glass 54 when reading the document G that is transported by the document transport device 52. The document reading device 56 moves in the direction of arrow H when reading the document G that is placed on the platen glass 54.

The image forming section 14 includes the image forming unit 50, which is an example of an image forming unit that forms an image by using a toner (developer). The image forming unit 50 includes a photoconductor drum 62, a charging member 64, an exposure device 66, a developing device 72, a transfer unit 70, and a cleaning device 73, which will be described below. The transfer unit 70 includes an intermediate transfer belt 68, a first transfer roller 67, an auxiliary roller 69, and a second transfer roller 71, which will be described below.

The photoconductor drum 62 is disposed in the middle of the apparatus body 10A of the image forming section 14. The photoconductor drum 62, which has a cylindrical shape, serves as a latent image holder. The photoconductor drum 62 is rotated by a driving unit (not shown) in the direction of arrow +R (clockwise in FIG. 1), and holds an electrostatic latent image that is formed by irradiation of light. The charging member 64 is disposed above the photoconductor drum 62 so as to face the outer peripheral surface of the photoconductor drum 62. The charging member 64 is a charge corotron that charges the surface of the photoconductor drum 62.

The exposure device 66 is disposed at a position downstream of the charging member 64 with respect to the rotation direction of the photoconductor drum 62 so as to face the outer peripheral surface of the photoconductor drum 62. The exposure device 66 includes a semiconductor laser (not shown), an f-θ lens, a polygon mirror, an imaging lens, and mirrors. The exposure device 66 deflects and scans a laser beam, which is emitted by a semiconductor laser, by using a polygon mirror on the basis of an image signal, and irradiates (exposes) the outer peripheral surface of the photoconductor drum 62, which has been charged by the charging member 64, with the laser beam, thereby forming an electrostatic latent image. The exposure device 66 need not deflect and scan a laser beam by using a polygon mirror. Instead, the exposure device 66 may be of a light emitting diode (LED) type.

The developing device 72 is disposed at a position downstream of an irradiated portion of the photoconductor drum 62 in the rotation direction of the photoconductor drum, the irradiated portion being irradiated with exposure light emitted by the exposure device 66. The developing device 72, which is of rotary switchable type, develops an electrostatic latent image that is formed on the outer peripheral surface of the photoconductor drum 62 with toner of predetermined colors.

The developing device 72 includes six developing units (reference numerals omitted) for yellow (Y), magenta (M), cyan (C), black (K), first special color (E), and second special color (F), which are arranged in the circumferential direction (counterclockwise in this order). The developing device 72 is rotated by 60° at a time by a motor (not shown), so that one of the developing units that performs developing faces the outer peripheral surface of the photoconductor drum 62. When forming a four-color image in Y, M, C, and K, the first special color (E) and the second special color (F) are not used. Therefore, the developing device 72 is rotated by 180° when the developing unit is switched from that for K to that for Y.

Each of the developing units is filled with developer (not shown) that has been supplied from a corresponding one of toner cartridges 78Y, 78M, 78C, 78K, 78E, and 78F through a toner supply path (not shown). Each of the developing units includes a developing roller 74 whose outer peripheral surface faces the outer peripheral surface of the photoconductor drum 62. The developing roller 74 includes a developing sleeve, which is cylindrical and rotatable, and a magnetic member, which is fixed to the inside of the developing sleeve. The magnetic member has plural magnetic poles. In the developing device 72, developer (carrier) forms a magnetic brush when the developing sleeve rotates, and the toner sticks to a latent image (electrostatic latent image) formed on the outer peripheral surface of the photoconductor drum 62, thereby developing the image.

The transfer unit 70 includes the intermediate transfer belt 68, and the toner image formed on the outer peripheral surface of the photoconductor drum 62 is transferred to the intermediate transfer belt 68. The intermediate transfer belt 68, which is an endless belt, is disposed downstream of the developing device 72 in the rotation direction of the photoconductor drum 62 and below the photoconductor drum 62. The intermediate transfer belt 68 is looped over a driving roller 61, a tension roller 65, transport rollers 63, and the auxiliary roller 69. The driving roller 61 rotates under control of the controller 20 (including the output control board 120 illustrated in FIG. 6). The tension roller 65 applies a tension to the intermediate transfer belt 68. The transport rollers 63 are in contact with the back side of the intermediate transfer belt 68 and rotated by the intermediate transfer belt 68. The auxiliary roller 69 is in contact with the back side of the intermediate transfer belt 68 at a second transfer position (described below) and rotated by the intermediate transfer belt 68. The intermediate transfer belt 68 is rotated by the driving roller 61 in the direction of arrow −R (counterclockwise in FIG. 1).

The first transfer roller 67 is disposed opposite the photoconductor drum 62 with the intermediate transfer belt 68 therebetween. The first transfer roller 67 first transfers the toner image, which has been formed on the outer peripheral surface of the photoconductor drum 62, to the intermediate transfer belt 68. The first transfer roller 67 is in contact with the back side of the intermediate transfer belt 68 at a position that is downstream of the position (first transfer position), at which the photoconductor drum 62 is in contact with the intermediate transfer belt 68 downstream, in the direction in which the intermediate transfer belt 68 moves. A power supply (not shown) applies a voltage to the first transfer roller 67, while the photoconductor drum 62 is grounded. Thus, the toner image is first transferred from the photoconductor drum 62 to the intermediate transfer belt 68 due to a potential difference between the first transfer roller 67 and the photoconductor drum 62.

The second transfer roller 71 is disposed opposite the auxiliary roller 69 with the intermediate transfer belt 68 therebetween. The second transfer roller 71 second transfers the toner image, which has been first transferred to the intermediate transfer belt 68, to a recording sheet P. The toner image is transferred to the recording sheet P at a second transfer position that is between the second transfer roller 71 and the auxiliary roller 69. The second transfer roller 71 is grounded and in contact with a surface of the intermediate transfer belt 68. A power supply (not shown) applies a voltage to the auxiliary roller 69, and the toner image is second transferred from the intermediate transfer belt 68 to the recording sheet P due to a potential difference between the auxiliary roller 69 and the second transfer roller 71.

A cleaning blade 59 is disposed opposite the driving roller 61 with the intermediate transfer belt 68 therebetween. The cleaning blade 59 recovers residual toner that is left on the intermediate transfer belt 68 after the second transfer. The cleaning blade 59 is attached to a housing (not shown) having an opening. The residual toner is scraped off the intermediate transfer belt 68 by an end of the cleaning blade 59 and recovered into the housing.

A position detection sensor 83 is disposed at a position outside the loop of the intermediate transfer belt 68 so as to face one of the transport rollers 63. The position detection sensor 83 detects a predetermined reference position on the intermediate transfer belt 68 by detecting a mark (not shown) printed on the surface of the intermediate transfer belt 68, and outputs a position detection signal that determines the timing at which image formation is started. The position detection sensor 83 detects a moving position of the intermediate transfer belt 68 by emitting light toward the intermediate transfer belt 68 and receiving the light reflected by the surface of the mark.

The cleaning device 73 is disposed at a position downstream of the first transfer roller 67 in the rotation direction of the photoconductor drum 62. The cleaning device 73 cleans residual toner and the like off the photoconductor drum 62. The residual toner is toner that has not been first transferred to the intermediate transfer belt 68 and left on the surface of the photoconductor drum 62. The cleaning device 73 recovers the residual toner and the like using a cleaning blade and a brush roller that contact the photoconductor drum 62.

A corotron 81 is disposed at a position upstream of the cleaning device 73 (and downstream of the first transfer roller 67) with respect to the rotation direction of the photoconductor drum 62. The corotron 81 eliminates the charge of the toner that has been left on the outer peripheral surface of the photoconductor drum 62 after the first transfer. A charge eliminating device 75 is disposed at a position that is downstream of the cleaning device 73 (and upstream of the charging member 64) with respect to the rotation direction of the photoconductor drum 62. The charge eliminating device 75 irradiates the outer peripheral surface of the photoconductor drum 62, after being cleaned, with light and thereby eliminates charges from the outer peripheral surface of the photoconductor drum 62.

The second transfer position, at which the second transfer roller 71 second transfers the toner image, is located on the transport path 28. A fixing device 90 is disposed on the transport path 28 at a position downstream of the second transfer roller 71 in the transport direction of the recording sheet P (in the direction of arrow A in FIG. 1). The fixing device 90 fixes the toner image, which has been transferred to the recording sheet P by the second transfer roller 71, onto the recording sheet P. The fixing device 90 includes a fixing roller 92 and a pressing roller 94. The fixing roller 92 performs fixing by heat. The pressing roller 94 presses the recording sheet P against the fixing roller 92. A transport roller 39 is disposed on the transport path 28 at a position downstream of the fixing device 90 in the transport direction of the recording sheet P. The transport roller 39 transports the recording sheet P toward the sheet output tray 15 or the reversing portion 33.

Next, the image processing device 100 will be described.

Figure 2:
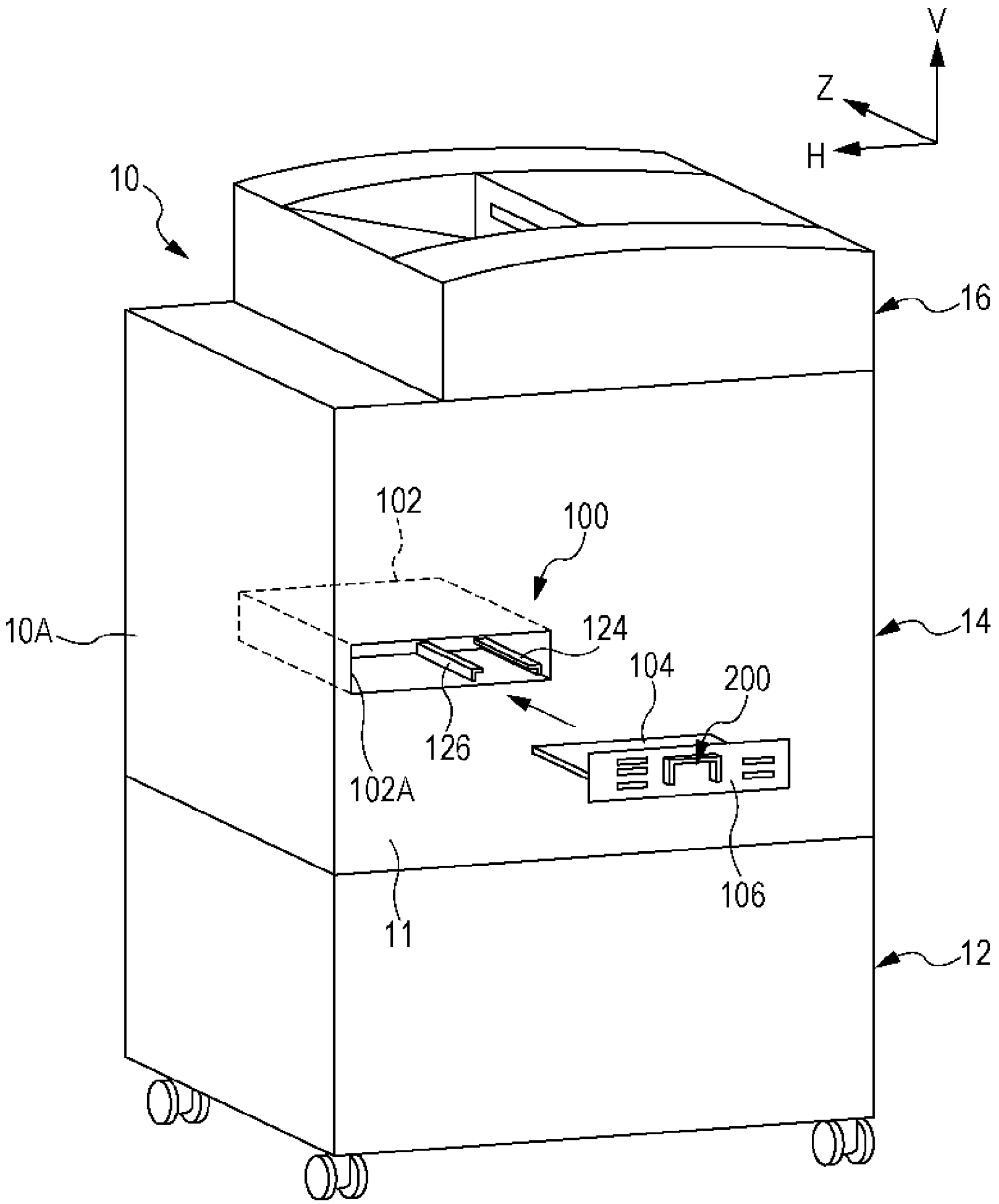
FIG. 2 is a rear perspective view of the image forming apparatus according to the exemplary embodiment of the invention.
Figure 3A:
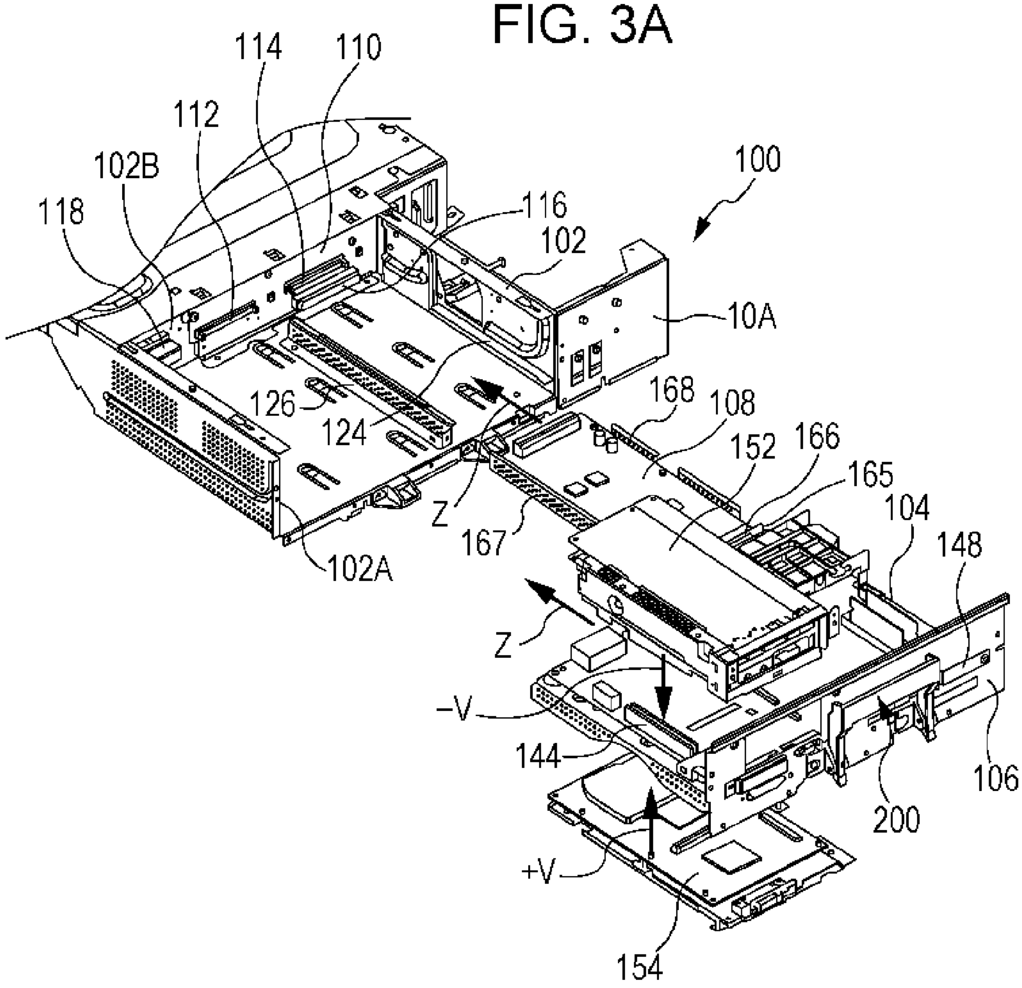
FIG. 3A is an exploded view of an image processing device according to an exemplary embodiment of the invention.
Figure 3B:
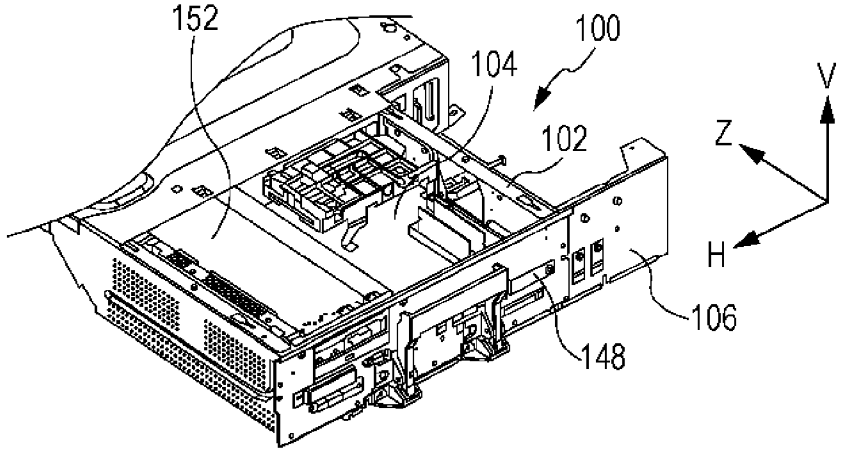
FIG. 3B is a perspective view of image processing device according to the exemplary embodiment of the invention when the image processing device is attached to the image forming apparatus.

As illustrated in FIG. 2, the image processing device 100 includes an image processing board 104, a first upgrade board 154 (see FIG. 3A), a side panel 106, and an extension board 108 (see FIG. 3A). The image processing board 104 performs image processing. The first upgrade board 154, which is an example of a functional board, is connected to the image processing board 104. The side panel 106 is attached to the image processing board 104. The image processing board 104 and the extension board 108 are disposed in a housing 102, which is an example of an apparatus body. The housing 102 is a rectangular box in plan view. The upper side of the housing 102 is covered with a metal plate (not shown) so as be resistant to electromagnetic noise. One of the four side walls is removed, and thereby an opening 102A is formed.

The housing 102 is disposed in the image forming apparatus 10 such that the opening 102A is positioned at a back panel 11 that is disposed on the back side of the apparatus body 10A of the image forming apparatus 10. The image processing device 100 is disposed in the left half of the image forming section 14 when the image forming apparatus 10 is viewed from the back side. In the following description, the direction from the back side toward the front side of the image forming apparatus 10 will be referred to as the direction of arrow Z.

As illustrated in FIG. 3A, an end wall 102B is disposed opposite the opening 102A in the housing 102, and a interconnection board 110, which extends vertically, is fixed to the end wall 102B with screws. The interconnection board 110 includes first connectors 112 and 114 that are disposed on a surface thereof facing the opening 102A. The first connectors 112 and 114, which are examples of a first connection portion, are disposed side by side. A second connector 116, which is an example of a second connection portion, is disposed below the first connector 114. A power feed connector 118, through which electric power is supplied to the image processing board 104, is disposed on a part of the surface of the end wall 102B that faces the opening 102A and to which the interconnection board 110 is not attached.

Figure 4A:
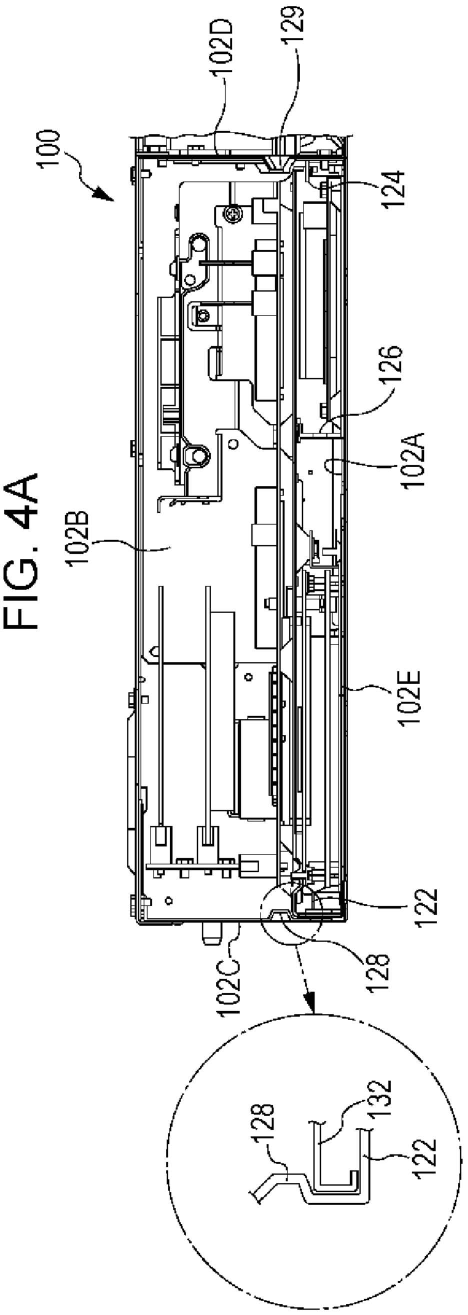
FIG. 4A is a sectional view of the image processing device according to the exemplary embodiment of the invention.
Figure 4C:
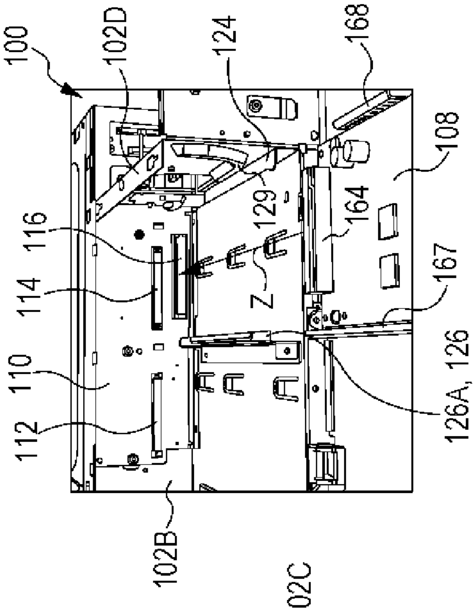
FIG. 4C illustrates how an extension board according to the exemplary embodiment of the invention is attached to the image forming apparatus.
Figure 4B:
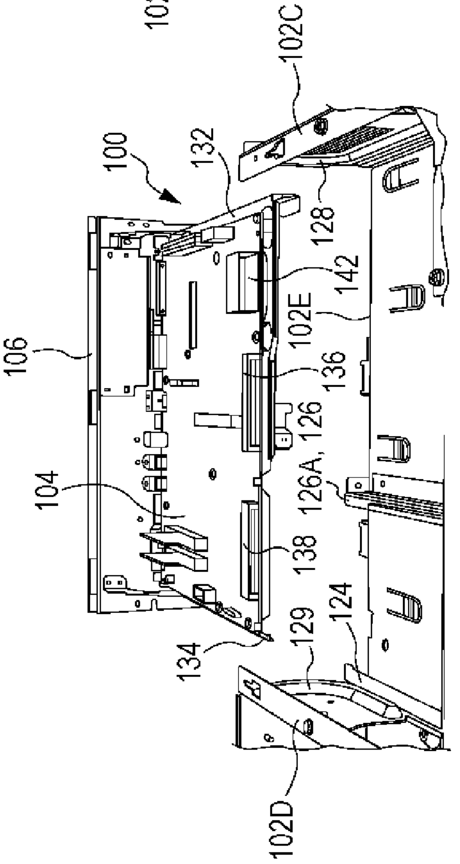
FIG. 4B is illustrates an image processing board according to the exemplary embodiment of the invention viewed from the inside of the image forming apparatus.

As illustrated in FIGS. 4A, 4B, and 4C, the housing 102 has a left side wall 102C, a right side wall 102D, and a bottom wall 102E, when the end wall 102B is viewed from the front side (viewed in the direction of arrow Z in FIG. 2). Guide rails 122 and 124 are disposed on the left side wall 102C and on the right side wall 102D, respectively. The guide rails 122 and 124 are flat plates that protrude into the housing 102. A guide rail 126 is disposed on a middle portion of the bottom wall 102E. The guide rail 126 has an L-shaped cross section in a front view. An upper part of the guide rail 126 is bent toward the guide rail 124 and forms a flat portion 126A.

The left side wall 102C has a guide portion 128 that is disposed above the guide rail 122 and that protrudes into the housing 102. The right side wall 102D has a guide portion 129 that is disposed above the guide rail 124 and that protrudes into the housing 102. Support frames 132 and 134, which are made of a metal, are attached to the left and right edges of the image processing board 104 (the left and right edges when vided from the side panel 106 side). When the image processing board 104 is inserted toward the end wall 102B, the support frame 132 is guided between the guide rail 122 and the guide portion 128 and the support frame 134 is guided between the guide rail 124 and the guide portion 129. The support frames 132 and 134 may be integrally formed.

As illustrated in FIG. 4B, connectors 136, 138, and 142 are disposed at an end of the image processing board 104 opposite to the end to which the side panel 106 is attached. The connectors 136 and 138 are to be connected to the first connector 112 and the first connector 114 (see FIG. 3A), respectively. The connector 142 is to be connected to the power feed connector 118 (see FIG. 3A). As illustrated in FIG. 5B, when the image processing board 104 is viewed in the direction of arrow Z (see FIG. 3A), an upper connector 144 is disposed on the upper surface of the image processing board 104 so as to face upward (in the direction of arrow +V), and a lower connector 146 is disposed on the lower surface of the image processing board 104 so as to face downward (the direction of arrow −V). Moreover, a connector 148 is disposed at an end of the image processing board 104 adjacent to the side panel 106. The connector 148 is exposed to the outside from the side panel 106.

As illustrated in FIGS. 3A and 5B, the first upgrade board 154, which is an example of a functional board, is disposed below the image processing board 104 (on the same side as the extension board 108), and a second upgrade board 152 is disposed above the image processing board 104. The first upgrade board 154 has a connector 155. The first upgrade board 154 is connected to the image processing board 104 by connecting the connector 155 to the lower connector 146. The second upgrade board 152 has a connector 153. The second upgrade board 152 is connected to the image processing board 104 by connecting the connector 153 to the upper connector 144.

Figure 5A:
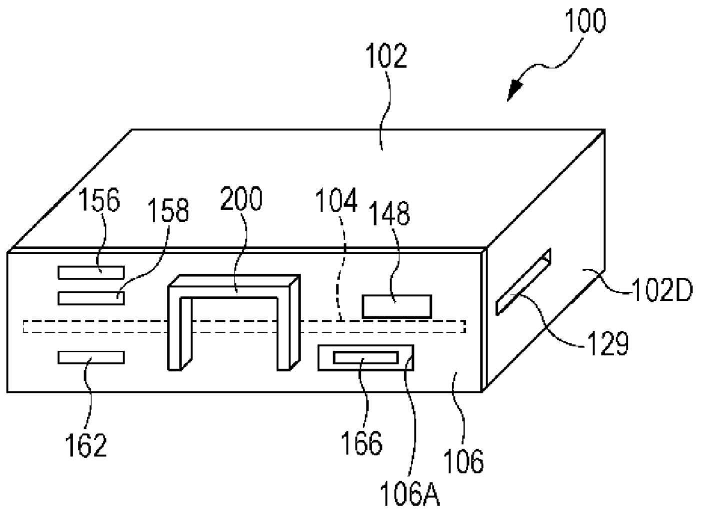
FIG. 5A is a schematic perspective view of the image processing device according to the exemplary embodiment of the invention.
Figure 5B:
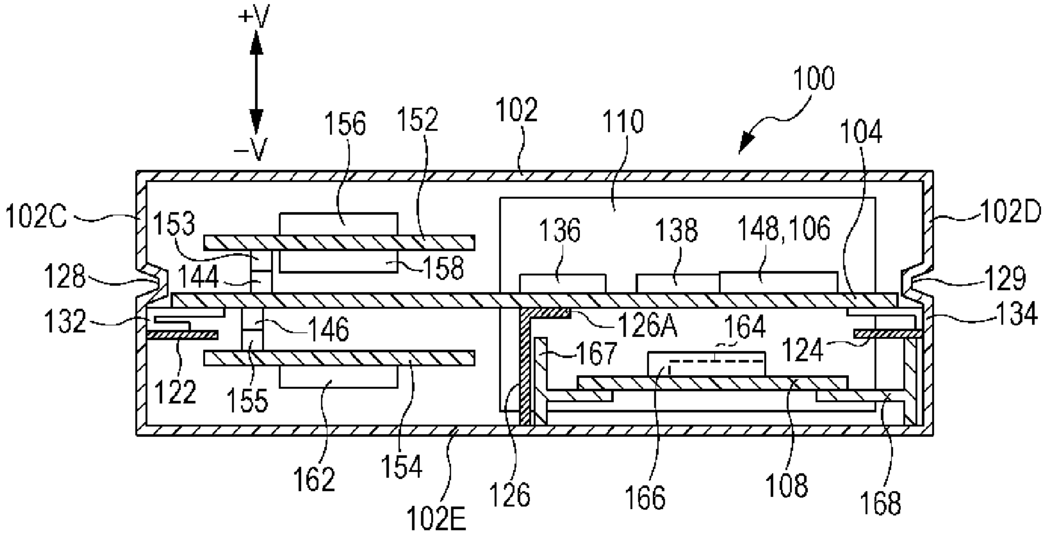
FIG. 5B is a schematic sectional view of the image processing device according to the exemplary embodiment of the invention.

As illustrated in FIGS. 5A and 5B, the second upgrade board 152 has connectors 156 and 158, which are respectively disposed above and below an end of the second upgrade board 152 that is adjacent to the side panel 106 when the second upgrade board 152 is connected to the image processing board 104. The first upgrade board 154 has a connector 162, which is disposed below an end of the first upgrade board 154 that is adjacent to the side panel 106 when the first upgrade board 154 is connected to the image processing board 104. The connectors 156, 158, and 162 are exposed to the outside from the side panel 106 when the first upgrade board 154 and the second upgrade board 152 are connected to the image processing board 104. The first upgrade board 154 is disposed on one side (the lower side) of the image processing board 104 so as to cover a part (a left part) of the lower surface of the image processing board 104.

As illustrated in FIGS. 3A and 4C, the extension board 108 has a size that allows the extension board 108 to be disposed between the guide rail 124 and the guide rail 126. A connector 164, which is to be connected to the second connector 116, is disposed at an end of the extension board 108 in the direction of arrow Z. A side panel 165 and a connector 166 are disposed at the other end of the extension board 108 (adjacent to the side panel 106) in the direction of arrow Z. Support frames 167 and 168, which are made of a metal, are attached to left and right edges of the extension board 108, when viewed in the direction of arrow Z. The support frames 167 and 168 are guided along the lower surface of the guide rail 124 and along the right side surface of the guide rail 126. As illustrated in FIG. 5A, a rectangular opening 106A is formed in the side panel 106 at a position below the connector 148 of the image processing board. The connector 166 of the extension board 108 is exposed to the outside through the rectangular opening 106A. The support frames 167 and 168 may be integrally formed.

As illustrated in FIG. 5B, the extension board 108 is disposed so as to cover another part (a right part of the lower surface) of the image processing board 104 on the same side as the first upgrade board 154 with respect to the image processing board 104. The extension board 108 is electrically connected to the second connector 116 (see FIG. 3A). Moreover, the extension board 108 is independently attachable to and removable from the image processing board 104. The extension board 108 is disposed in a space surrounded by the image processing board 104, the first upgrade board 154, the side panel 106 (see FIG. 3A), and the interconnection board 110. The extension board 108 is replaceable by a user when the user has pulled out the image processing board 104 and the side panel 106 in a direction opposite to the direction of arrow Z.

Next, how the boards are connected to each other in the image processing device 100 will be described.

Figure 6:
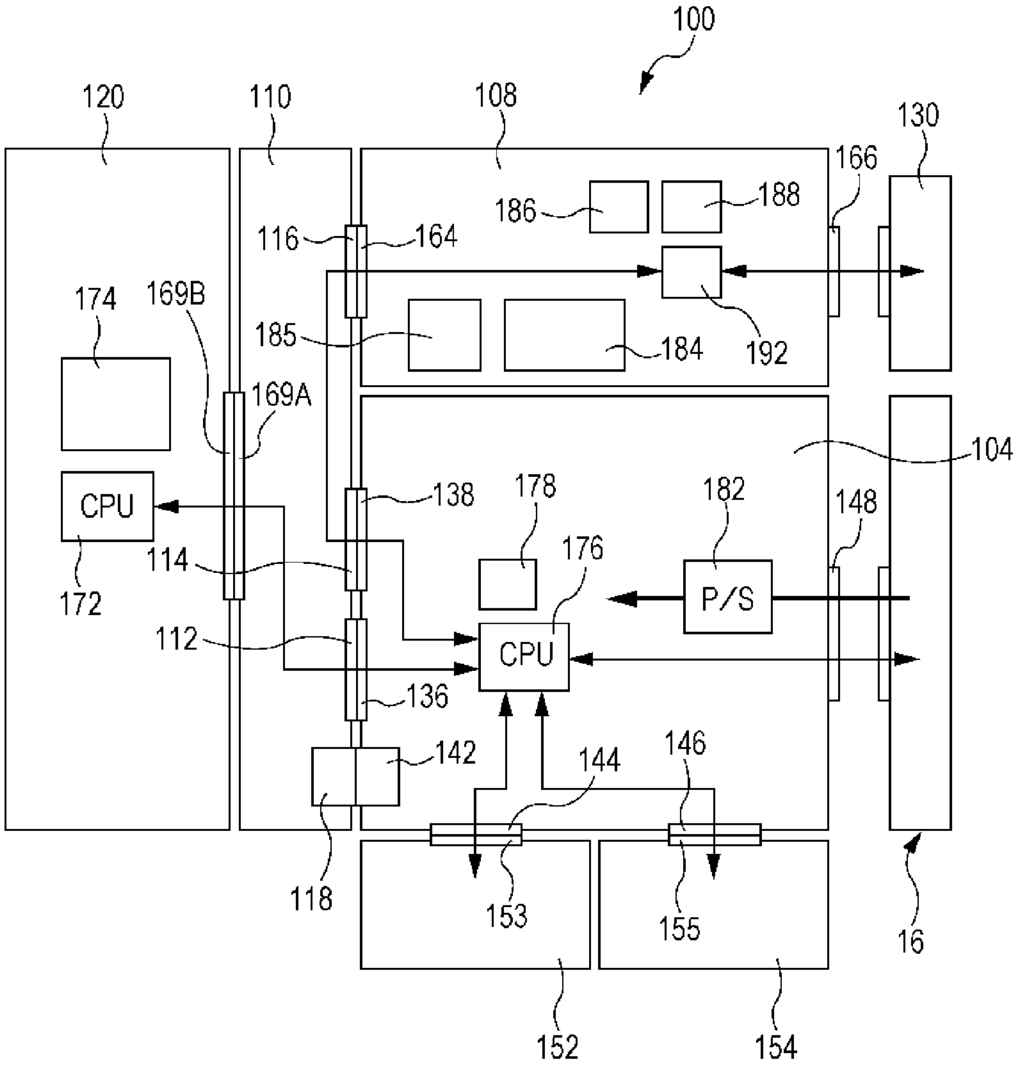
FIG. 6 is a schematic diagram illustrating how boards are connected to each other in the image processing device according to the exemplary embodiment of the invention.

FIG. 6 is a schematic diagram of the image processing device 100. The output control board 120 is disposed on a side of the interconnection board 110 opposite to the side on which the image processing board 104 is disposed (in the direction of arrow Z in FIG. 3A). The output control board 120 has a connector 169B that is connected to the connector 169A of the interconnection board 110. The output control board 120 includes a central processing unit (CPU) 172 and a screen processor 174. The output control board 120 performs image processing and the like on received image data so that an image is output by the image forming unit 50 (see FIG. 1). The CPU 172 controls the output control board 120. The screen processor 174 controls the pixels of the image data, which has been sent from the image processing board 104, in order to provide gradation to an image and generate a screen. The output control board 120 is covered by a housing 121 (see FIG. 9A).

The image processing board 104 performs image processing on the image data that has been read by the document reading section 16. The image processing board 104 includes a CPU 176 that performs control, an image processing module 178, a serial/parallel converter 182, and a data bus (not shown). The image processing module 178 processes image data that has been received through the serial/parallel converter 182. The image processing board 104 is connected to the document reading section 16 through the connector 148 and a cable (not shown). The second upgrade board 152 and the first upgrade board 154 are connected to an external apparatus through the connectors 156, 158, and 162 described above (see FIG. 5A, not shown in FIG. 6). The second upgrade board 152 and the first upgrade board 154 are replaceable in order to change the function of the image forming apparatus 10 or for other purposes.

The extension board 108 is, for example, a video selector circuit board. The extension board includes a scan vide selector 184, a print vide selector 185, a deserializer 186, a serializer 188, a low voltage differential signaling (LVDS) 192, and a bus (not shown) that connects these components to one another. These components perform data communication between the image processing board 104 and an external control device 130. Image data that has been sent from the document reading section 16 is supplied to the external control device 130 by the scan vide selector 184 of the extension board 108. Image data that has been sent from the external control device 130 is supplied to the output control board 120 through the print vide selector 185, and the image forming unit 50 (see FIG. 1) outputs an image.

In FIG. 6, an image is output to the output control board 120 along the following three paths. A first path extends from the document reading section 16, via the image processing board 104 and the interconnection board 110, to the output control board 120. A second path extends from the image processing board 104, via the interconnection board 110, to the output control board 120. A third path extends from the external control device 130, via the extension board 108 and the interconnection board 110, to the output control board 120. Image data that has been read is sent along the following two paths. A first path extends from the document reading section 16 to the image processing board 104. A second path extends from the document reading section 16; via the image processing board 104, the interconnection board 110, and the extension board 108; to the external control device 130.

Next, the structure of a handle 200, which is disposed on the side panel 106, will be described.

Figure 8A:
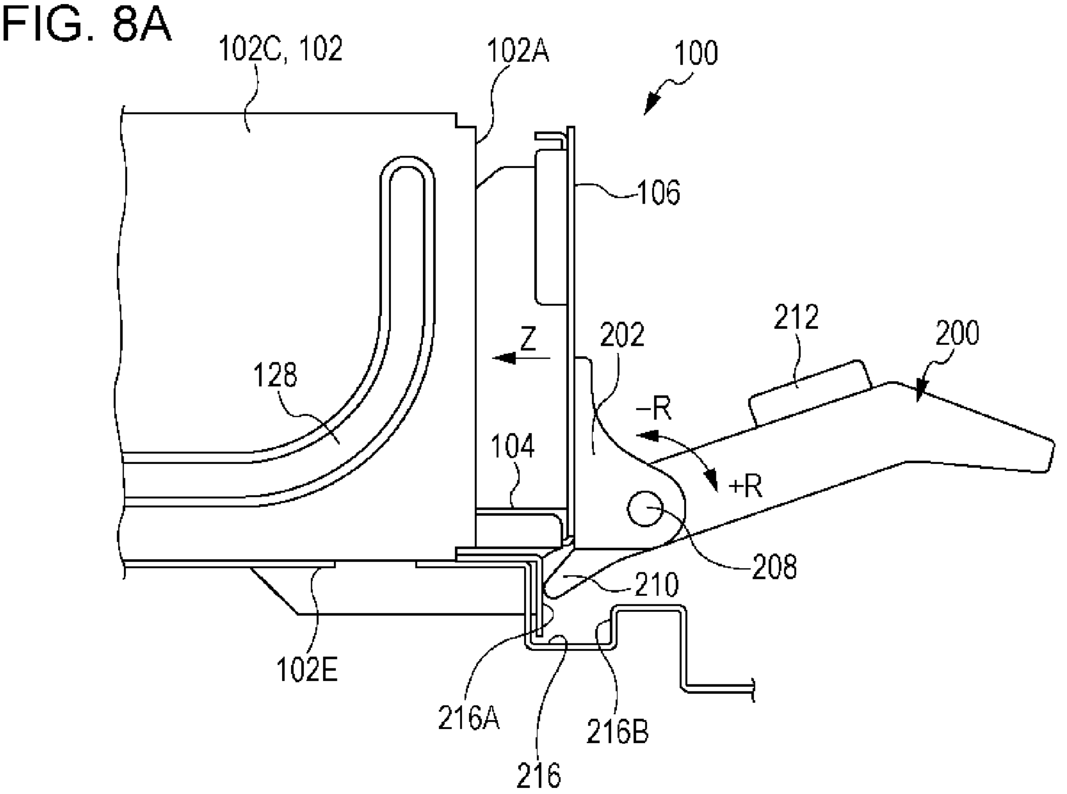
FIGS. 8A and 8B illustrate the handle of the image processing device according to the exemplary embodiment of the invention when the handle is pulled and pushed, respectively.

As illustrated in FIG. 8A, the handle 200 and a support member 202, which are examples of a leverage mechanism, are disposed on a side of the side panel 106 opposite to the side on which the image processing board 104 is disposed. The handle 200 is made by integrally molding a resin. The handle is supported on the side panel 106 by a pair of support members 202 so as to be rotatable (movable) in the direction of arrow +R (clockwise when viewed from the left side wall 102C) and in the direction of arrow −R (counterclockwise when viewed from the left side wall 102C) with respect to the direction of arrow Z, i.e., the direction in which the image processing board 104 is connected to the side panel 106.

Figure 7:
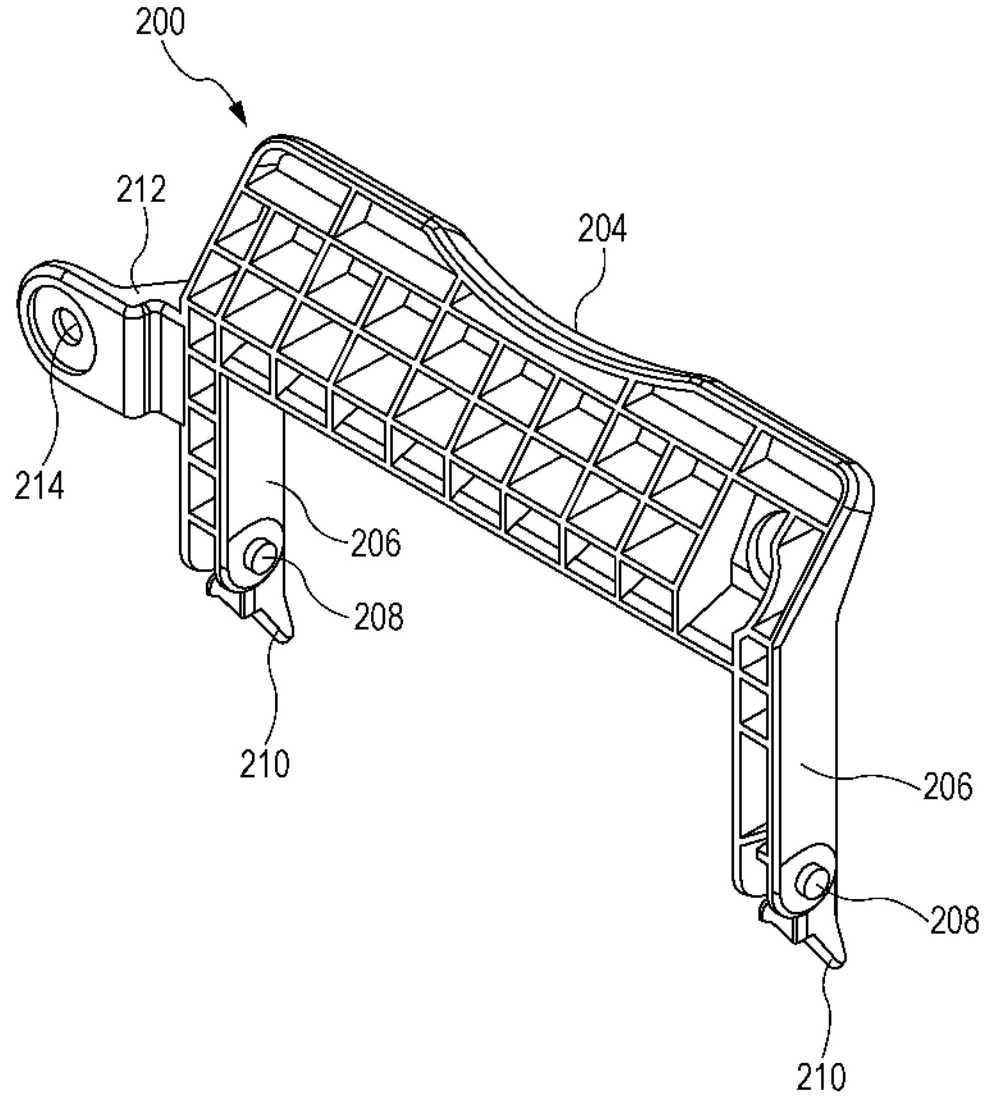
FIG. 7 is a perspective view of a handle of the image processing device according to the exemplary embodiment of the invention.

As illustrated in FIG. 7, the handle 200, which is angular U-shaped, includes a grip portion 204 and a pair of leg portions 206 that are integrally formed. The pair of leg portions 206 extend from both ends of the grip portion 204 in the same direction (a direction that is perpendicular to the grip portion 204). Each of the leg portions 206 includes a support shaft 208, which extends outward from a side surface of the handle 200, and a contact portion 210, which is disposed below the support shaft 208. The contact portion 210 is in a lower part of the leg portion 206 and extends diagonally with respect to the axial direction of the leg portion 206 (so as to become away from the side panel 106). The contact portion 210 has a triangular shape when viewed in the axial direction of the support shaft 208. An arm portion 212 is disposed on one of the leg portion 206. The arm portion 212 extends outward from the leg portion 206 in the axial direction of the support shaft 208. A through-hole 214, which is stepped, is formed in the arm portion 212. A screw is screwed into the through-hole 214 and a screw hole (not shown) that is formed in the side panel 106, so that the handle 200 is fixed to the side panel 106.

As illustrated in FIG. 8A, an extension portion of the bottom wall 102E of the housing 102, above which the side panel 106 is disposed, extends further from the opening 102A in a direction opposite to the direction of arrow Z. This extension portion of the bottom wall 102E is bent so as to form a recess 216, which has a crank-like shape. The recess 216 is an example of a leverage mechanism. The recess 216, which is open upward, extends in the axial direction of the support shaft 208. The recess 216 has a side wall 216A that stands at an end thereof in the direction of arrow Z and a side wall 216B that stands at the opposite end thereof. When a user inserts the image processing board 104 into the housing 102 when the handle 200 has been pulled in the direction of arrow +R, the contact portion 210 contacts the side wall 216A. Therefore, when a user pulls the image processing board 104 out of the housing 102, a pull-out force is applied to the image processing board 104 by pulling the handle 200 in the direction of arrow +R and thereby making the contact portion 210 contact the side wall 216A.

Figure 8B:
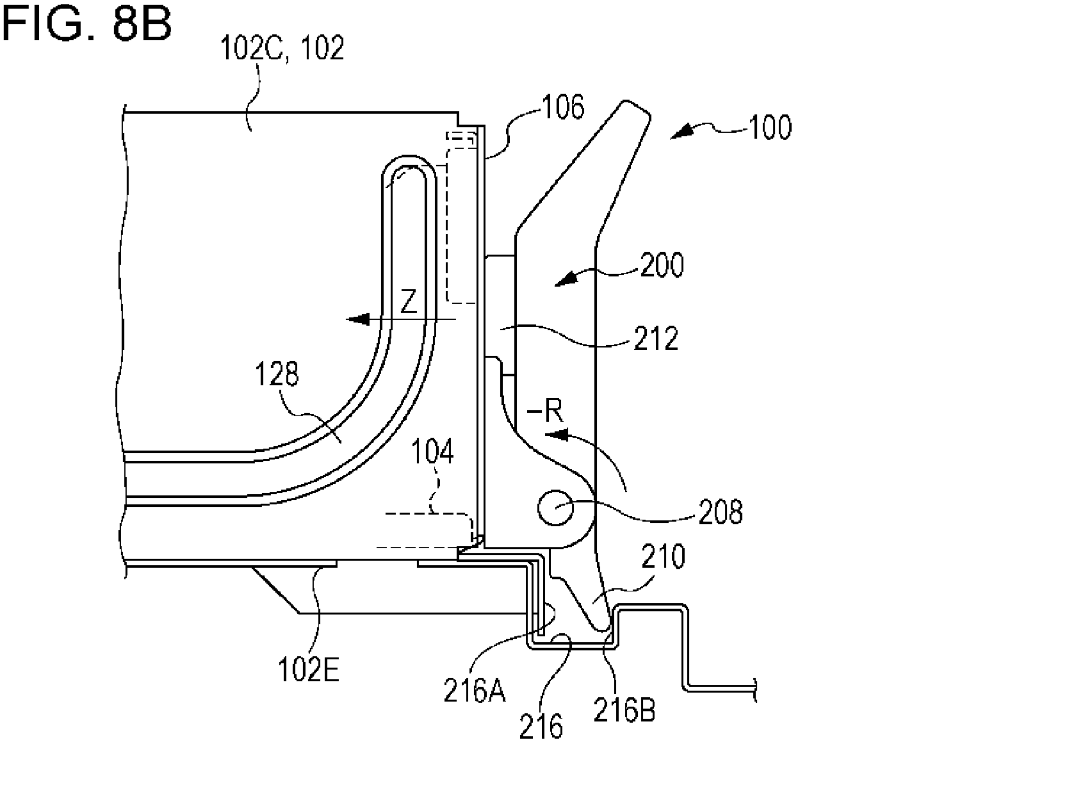

When a user pushes the handle 200 in the direction of arrow −R when the contact portion 210 is located in the recess 216 as illustrated in FIG. 8B, the contact portion 210 contacts the side wall 216B, and the image processing board 104 is urged in the direction of arrow Z. That is, when the user applies an operating force to connect the image processing board 104 to the first connectors 112 and 114 (see FIG. 4C), the handle 200, the support member 202, and the recess 216 multiply the operating force due to the principle of leverage. Moreover, the multiplied operating force is transferred through the side panel 106 and acts as a force that connects the extension board 108 to the second connector 116.

Next, the lengths of the image processing board 104 and the extension board 108 in the connection direction (the direction of arrow Z) will be described.

Figure 9A:
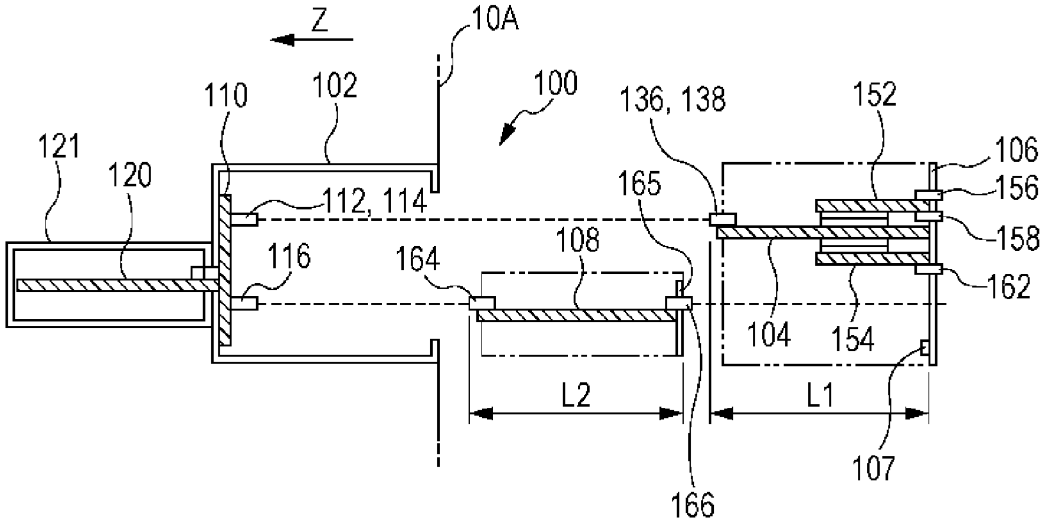
FIG. 9A is a schematic sectional view illustrating the lengths of the image processing board and the extension board according to the exemplary embodiment of the invention.
Figure 9B:
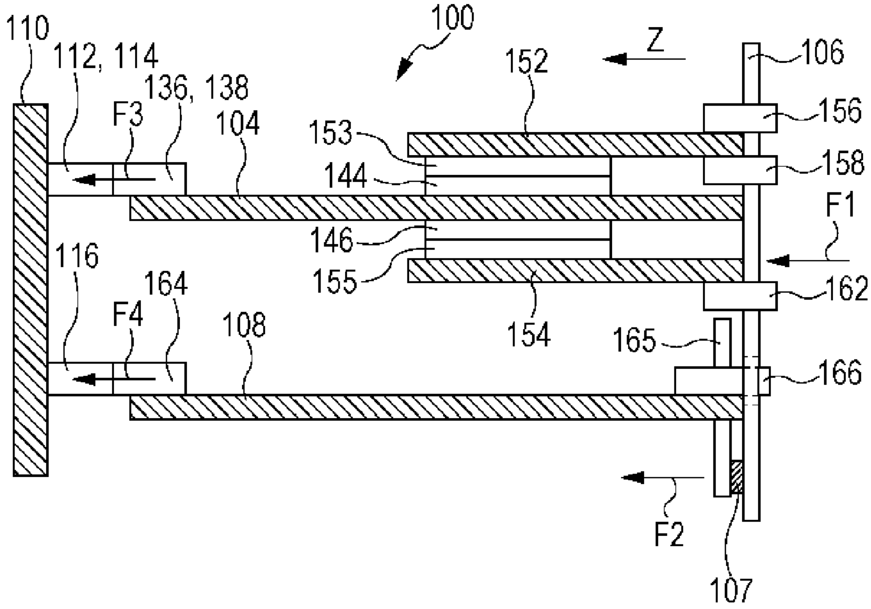
FIG. 9B is a schematic sectional view illustrating a state in which the image processing board and the extension board are connected to an interconnection board according to the exemplary embodiment of the invention.

FIG. 9A is a schematic sectional view illustrating the lengths of the image processing board 104 and the extension board 108. FIG. 9B is a schematic sectional view illustrating a state in which the image processing board 104 and the extension board 108 are connected to the interconnection board 110. In reality, as illustrated in FIG. 5B, the extension board 108 is disposed at a position adjacent to the first upgrade board 154 and slightly below the first upgrade board 154. In FIGS. 9A and 9B, however, in order to clearly illustrate the relationships among the lengths of the image processing board 104, the first upgrade board 154, and the extension board 108, the distance between the extension board 108 and the image processing board 104 in the vertical direction is exaggerated and enlarged.

As illustrated in FIG. 9A, in the image processing device 100, the extension board 108 is connected to the second connector 116 in a direction that is the same as the direction in which the image processing board 104 is connected to the first connectors 112 and 114 (the direction of arrow Z). The length L1 of the image processing board 104 in the direction of arrow Z and the length L2 of the extension board 108 in the direction of arrow Z are determined such that, for example, L1>L2. A pressing member 107, which is electroconductive, is disposed on the inner side of the side panel 106 (that faces a side panel 165 of the extension board 108). The pressing member 107 is a part of the side panel 106, and a plate spring made of a metal, for example, is used as the pressing member 107.

The image processing device 100 is configured such that, when the connector 164 is connected to the second connector 116 and the extension board 108 is electrically connected to the interconnection board 110 and the connectors 136 and 138 are connected to the first connectors 112 and 114 and the image processing board 104 is electrically connected to the interconnection board 110, the side panel 106 (including the pressing member 107) contacts the side panel 165 of the extension board 108. The extension board 108 is configured such that the position of the connector 166 is determined when the image processing board 104 is connected to the interconnection board 110.

Next, the operation of the present exemplary embodiment will be described.

As illustrated in FIG. 5B, in the image processing device 100, the extension board 108 is disposed in a vacant region (space) surrounded by the image processing board 104, the first upgrade board 154, the interconnection board 110, and the side panel 106 (see FIG. 5A). Therefore, an additional space for disposing the extension board 108 is not necessary, so that an increase in the size of the image processing device 100 is suppressed.

As illustrated in FIG. 8A, with the image processing device 100, when connecting the image processing board 104 to the interconnection board 110 (see FIG. 5B), a user pushes the image processing board 104 in the direction of arrow Z while gripping the handle 200 with one hand. At this time, the contact portion 210 of the handle 200 contacts the side wall 216A of the recess 216 before the connectors 136 and 138 of the image processing board 104 are connected to the first connectors 112 and 114 (see FIG. 9A) of the interconnection board 110.

Next, as illustrated in FIG. 8B, when the user further pushes the image processing board 104 in the direction of arrow Z, the handle 200 rotates in the direction of arrow –R around the support shaft 208. Then, the contact portion 210 contacts the side wall 216B at a contact portion that serves as the point of application of leverage, and the support shaft 208 serves as the fulcrum of the leverage. Therefore, even if the handle 200 is moved in small range, a force is generated so as to push the image processing board 104 in the direction of arrow Z. Thus, in FIG. 9A, the first connectors 112 and 114 are connected to the connectors 136 and 138 while preventing poor connection.

Moreover, as illustrated in FIG. 9B, the image processing device 100 is configured such that the extension board 108 is first inserted into the housing 102 and then the image processing board 104 is inserted into the housing 102. When the image processing board 104 is inserted in the direction of arrow Z, the side panel 106 contacts the side panel 165 of the extension board 108 with the pressing member 107 therebetween and thereby urges the extension board 108 in the direction of arrow Z. That is, for example, when the side panel 106 is pushed in the direction of arrow Z with a force F1, the side panel 165 is urged with a force F2 have a magnitude that corresponds to the force F1, and an urging force F3 is applied to the connectors 136 and 138 and an urging force F4 is applied to the connector 164. As a result, the connector 164 is connected to the second connector 116 while preventing poor connection.

Thus, poor connection is prevented in the image processing device 100, and in the image forming apparatus 10 illustrated in FIG. 1, the image forming unit 50 forms an image on the basis of image information sent from the document reading section 16.

The present invention is not limited to the exemplary embodiment described above.

One of the first upgrade board 154 and the second upgrade board 152 may be omitted. In this case, the extension board 108 may be disposed in a space that formed by one of upgrade boards that is provided and the image processing board 104. The pressing member 107 may not be provided on the side panel 106, and the side panel 106 may directly contact the side panel 165. The connectors need not be disposed so as to be oriented horizontally, and may be disposed so as to be oriented vertically.

The side panel 106 and the handle 200 may be covered with a back cover so as to be concealed after the image processing board 104 and the extension board 108 have been connected to the interconnection board 110. The image forming unit 50 need not be an electophotographic image forming unit, and may be an inkjet image forming unit.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An image processing device comprising:

a body that has a first connection portion and a second connection portion inside the body;

an image processing board that is electrically connected to the first connection portion, the image processing board performing image processing;

a functional board that is disposed so as to cover a part of the image processing board on one side of the image processing board, the functional board having at least one function;

a side panel attached to the image processing board at a position opposite to the first connection portion, the side panel being a part of a side surface of the body;

an extension board that is disposed so as to cover another part of the image processing board on the same side as the functional board with respect to the image processing board, the extension board being electrically connected to the second connection portion, and the extension board being independently attachable to and removable from the image processing board; and a leverage mechanism that multiplies an operating force when the image processing board is connected to the first connection portion, wherein the operating force multiplied by the leverage mechanism is transferred through the side panel and serves as a force that connects the extension board to the second connection portion.

2. The image processing device according to claim 1, wherein the extension board is connected to the second connection portion in a direction that is the same as a direction in which the image processing board is connected to the first connection portion, and wherein the side panel contacts the extension board when the extension board is connected to the second connection portion and the image processing board is connected to the first connection portion.

3. An image forming apparatus comprising:

an image forming unit that forms an image on the basis of image information; and the image processing device according to claim 1, the image processing device transferring the image information after being processed to the image forming unit.

4. An image forming apparatus comprising:

an image forming unit that forms an image on the basis of image information; and the image processing device according to claim 2, the image processing device transferring the image information after being processed to the image forming unit.

5. The image processing device according to claim 1, wherein the leverage mechanism comprises a handle and a support member, the handle being supported by the support members so as to be rotatable.

6. The image processing device according to claim 5, wherein the body comprises a recess, and a portion of the handle rotatably engages with the recess in order to multiply the operating force.

* * * * *